US010644047B2

(12) United States Patent
Hofrichter et al.

(10) Patent No.: US 10,644,047 B2
(45) Date of Patent: May 5, 2020

(54) OPTOELECTRONIC DEVICE WITH A REFRACTIVE ELEMENT AND A METHOD OF PRODUCING SUCH AN OPTOELECTRONIC DEVICE

(71) Applicant: ams AG, Unterpremstaetten (AT)

(72) Inventors: Jens Hofrichter, Gattikon (CH); Franz Schrank, Graz (AT); Joerg Siegert, Graz (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 16/069,802

(22) PCT Filed: Dec. 15, 2016

(86) PCT No.: PCT/EP2016/081224
§ 371 (c)(1),
(2) Date: Jul. 12, 2018

(87) PCT Pub. No.: WO2017/121572
PCT Pub. Date: Jul. 20, 2017

(65) Prior Publication Data
US 2019/0035835 A1   Jan. 31, 2019

(30) Foreign Application Priority Data

Jan. 13, 2016 (EP) ..................... 16151134

(51) Int. Cl.
*H01L 27/146* (2006.01)
*H01L 31/0232* (2014.01)

(52) U.S. Cl.
CPC .. *H01L 27/14618* (2013.01); *H01L 27/14625* (2013.01); *H01L 27/14685* (2013.01); *H01L 27/14687* (2013.01); *H01L 31/02327* (2013.01)

(58) Field of Classification Search
CPC ......... H01L 27/14618; H01L 27/14625; H01L 27/14685; H01L 27/14687; H01L 31/02327
See application file for complete search history.

(56) References Cited

U.S. PATENT DOCUMENTS

| 2006/0043262 | A1* | 3/2006 | Akram | H01L 27/14618 250/208.1 |
| 2008/0290435 | A1* | 11/2008 | Oliver | B29D 11/00375 257/432 |
| 2011/0147869 | A1 | 6/2011 | Lazarov et al. | |
| 2011/0147872 | A1* | 6/2011 | Inoue | G02B 5/1814 257/432 |

(Continued)

FOREIGN PATENT DOCUMENTS

| EP | 1079613 A2 | 2/2001 |
| EP | 1267399 A2 | 12/2002 |

(Continued)

*Primary Examiner* — Joseph M Galvin, III
(74) *Attorney, Agent, or Firm* — Fish & Richardson P.C.

(57) ABSTRACT

A top surface of a substrate is provided with a detection element for detecting electromagnetic radiation. A refractive element is formed by a portion of a cover element, which is attached to the substrate, so that the refractive element is arranged facing the detection element. The refractive element may be arranged within a recess of the cover element, so that a cavity is formed between the detection element and the refraction element.

17 Claims, 11 Drawing Sheets

(56) References Cited

U.S. PATENT DOCUMENTS

| | | |
|---|---|---|
| 2012/0056291 A1 | 3/2012 | Suzuki et al. |
| 2013/0032914 A1* | 2/2013 | Iwasaki ............ H01L 27/14621 |
| | | 257/432 |
| 2014/0093207 A1 | 4/2014 | Hofrichter et al. |
| 2014/0093213 A1 | 4/2014 | Hofrichter et al. |
| 2014/0111947 A1* | 4/2014 | Henniger ............. H01L 23/055 |
| | | 361/728 |
| 2014/0367668 A1 | 12/2014 | Fujii et al. |
| 2015/0287756 A1* | 10/2015 | Ezoe ................... C09D 201/00 |
| | | 257/432 |

FOREIGN PATENT DOCUMENTS

| | | |
|---|---|---|
| EP | 1612528 A2 | 1/2006 |
| EP | 2802009 A1 | 11/2014 |
| EP | 2927716 A1 | 10/2015 |
| JP | H09 113352 A | 5/1997 |
| WO | 2007/043509 A1 | 4/2007 |

\* cited by examiner

OPTOELECTRONIC DEVICE WITH A REFRACTIVE ELEMENT AND A METHOD OF PRODUCING SUCH AN OPTOELECTRONIC DEVICE

BACKGROUND OF THE INVENTION

The present invention relates to the field of optoelectronic devices for applications including electromagnetic radiation, in particular detection devices for the detection of infrared radiation (IR). Applications may include gesture detection, security or safety applications, thermal imaging, thermal management, and night vision, for instance.

A passive element directing the propagation of radiation, like a focusing element, can be integrated in the housing or package of an optoelectronic device. If radiation directing elements are produced on a wafer, recesses are formed in one main surface to provide cavities for the accommodation of optical components like radiation sensors, and the radiation directing elements are formed in the opposite main surface.

EP 2 802 009 A1 discloses an imaging device comprising a substrate with an integrated circuit and a cover enclosing a cavity accommodating a sensor. A surface opposite the cavity has a structure directing incident radiation. The structure may be a plate zone or a Fresnel lens focusing infrared radiation and is preferably etched into the relevant surface. At least one through-substrate via may be provided to connect the sensor with a connection pad on the surface of the substrate opposite the cavity.

EP 1 079 613 A2 discloses an image input apparatus with a photoelectric converter element having a flat photosensitive surface and an array of image formation units, which individually receive light beams substantially from an identical area and focus the received light beams on different regions of the photosensitive surface of the photoelectric converter element to form images thereon.

EP 1 267 399 A2 discloses an electronic device having a cap body sealed to a substrate and method for manufacturing the same. An Al film is formed on a cap wafer and patterned into a ring-shaped film. Dry etching is performed to form a drum portion enclosing a recess portion to provide a vacuum dome. The cap wafer is placed on a main body wafer comprising an infrared area sensor. The ring-shaped film is joined to the main body wafer by pressure bonding.

EP 1 612 528 A2 discloses a microstructure infrared sensor focusing radiation on a thermocouple absorbing layer, using a convex lens area made in a photosensitive resist in a recess on the top of the chip cap.

US 2014/0093207 A1 and US 2014/0093213 A1 disclose optical adaptors having monolithically integrated optical elements and micro-mechanical features, the latter defining at least a horizontal reference surface and a vertical reference surface; wherein the horizontal reference surface is perpendicular to an optical plane, the latter being perpendicular the optical axis of the optical elements; and wherein the vertical reference surface is perpendicular to the horizontal reference surface and parallel to the optical axis.

US 2012/0056291 A1 discloses an imaging device including a substrate, a photodetecting portion, a circuit portion and a through interconnect. A lens is arranged on the top surface of the device by means of a holder keeping it in place.

US 2011/0147869 A1 discloses an infrared radiation sensor device including an integrated circuit radiation sensor chip including first and second temperature-sensitive elements connected within a dielectric stack of the chip. A diffractive optical element is integrated with a back surface of the radiation sensor chip to direct infrared radiation toward the first temperature-sensitive element.

US 2011/0147872 A1 discloses an optical semiconductor device, which comprises a light receiving part formed on a main surface and a transparent board laminated above the main surface, an adhesive material being interposed. The transparent board is provided with a serrated part on the main surface facing the semiconductor device and/or on the back surface.

SUMMARY OF THE INVENTION

The optoelectronic device comprises a substrate having opposite main surfaces, which will be referred to as top surface and bottom surface. The substrate may optionally comprise an integrated circuit. A cover element having opposite main surfaces, which will be referred to as front surface and rear surface, is attached to the substrate above the top surface, so that the top surface of the substrate faces the rear surface of the cover element. An optional bonding layer can be provided for attaching the cover element to the substrate. A detection element, which is provided for detecting electromagnetic radiation, is arranged in a dielectric layer at the top surface of the substrate. A refractive element, which is provided to direct the propagation of electromagnetic radiation, is arranged above the detection element. The refractive element is formed by a portion of the cover element at the rear surface of the cover element. A metal layer is arranged in the dielectric layer and contacted by a through-substrate interconnection in the substrate.

In an embodiment of the optoelectronic device, a recess is present at the rear surface of the cover element. The recess forms a cavity between the detection element and the refractive element.

In a further embodiment, an intermediate layer is arranged between the substrate and the cover element. The intermediate layer comprises an opening between the detection element and the refractive element. Optional bonding layers can be provided between the substrate and the intermediate layer, and between the intermediate layer and the cover element.

In a further embodiment, a recess is present at the rear surface of the cover element, and an intermediate layer is arranged between the substrate and the cover element. The intermediate layer comprises an opening between the detection element and the refractive element. The recess and the opening form a cavity between the detection element and the refractive element. Optional bonding layers can be provided between the substrate and the intermediate layer, and between the intermediate layer and the cover element.

In a further embodiment, a recess is present at the rear surface of the cover element, the recess forming a cavity between the detection element and the refractive element, and an intermediate layer is arranged between the substrate and the cover element, the intermediate layer comprising an opening, which forms a further cavity between the detection element and the refractive element. The further cavity is separated from the cavity by the intermediate layer. Optional bonding layers can be provided between the substrate and the intermediate layer, and between the intermediate layer and the cover element.

In a further embodiment, a further refractive element is formed in the intermediate layer within the further recess.

In a further embodiment, the refractive element extends over the entire rear surface of the cover element within the recess.

In a further embodiment, a getter layer is applied to the rear surface of the cover element within the recess. The getter layer may particularly be applied to a plane area of the rear surface outside the refractive element.

In a further embodiment, the front surface of the cover element is structured in the area of the refractive element.

In the method of producing an optoelectronic device, a substrate is provided with a dielectric layer, and detection elements and a metal layer are arranged in the dielectric layer. The detection elements are provided for detecting electromagnetic radiation. A through-substrate interconnection is formed in the substrate, the through-substrate interconnection contacting the metal layer. The further substrate is attached, optionally by bonding, to the substrate, the surface structures facing the detection elements, so that the dielectric layer is arranged between the substrate and the further substrate.

In a variant of the method, the surface structures of the further substrate are formed within recesses.

In a further variant of the method, the through-substrate interconnection, including a via hole and a metallization, is formed before the further substrate is bonded to the substrate.

In a further variant of the method, the through-substrate interconnection, including a via hole and a metallization, is formed after the further substrate is bonded to the substrate.

In a further variant of the method, the surface structures of the further substrate are formed by applying a reflow layer on the further substrate, structuring the reflow layer to form separate portions having curved surfaces, and transferring the curved surfaces to the further substrate.

In the following, embodiments and variants of the invention are described in more detail in conjunction with the accompanying figures.

DETAILED DESCRIPTION

Figure 1:
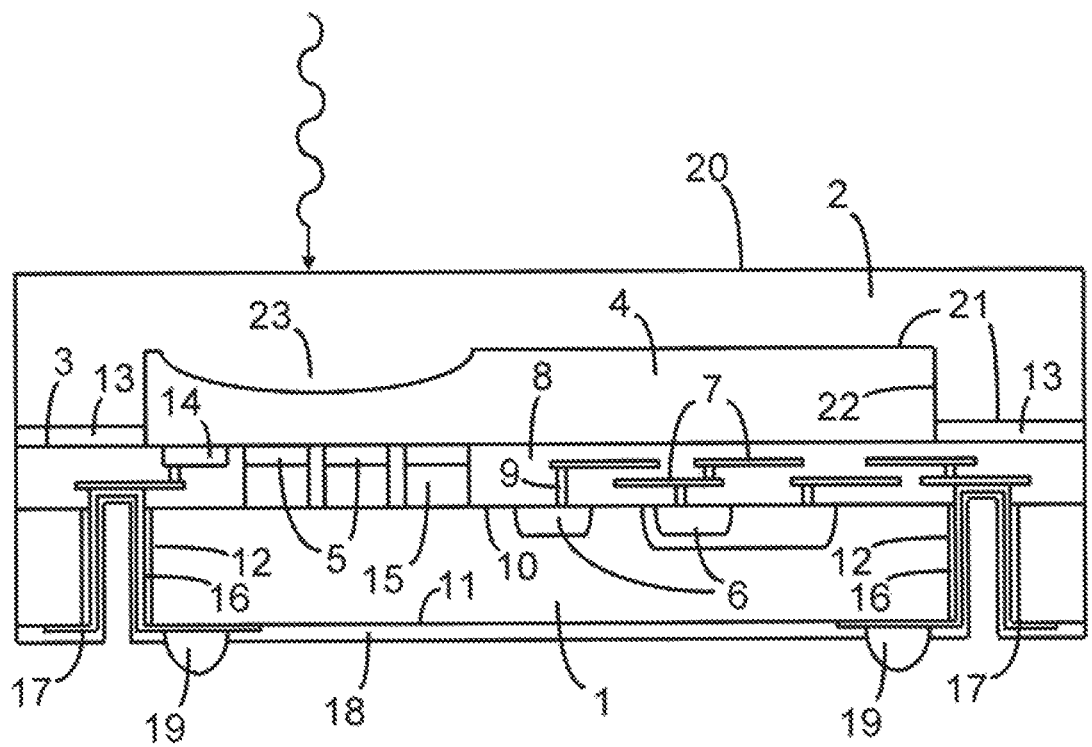
FIG. 1 is a cross section of an embodiment of the optoelectronic device.

FIG. 1 is a cross section of an embodiment of the optoelectronic device, which comprises a substrate 1 and a cover element 2. The substrate 1 may comprise a semiconductor material like silicon, for instance. The cover 2 may also comprise a semiconductor material, in particular the same material as the substrate 1, or a dielectric material like silicon dioxide or borosilicate glass, for instance. The substrate 1 has opposite main surfaces, which will be referred to as top surface 10 and bottom surface 11. The cover element 2 also has opposite main surfaces, which will be referred to as front surface 20 and rear surface 21 in order to distinguish them from the main surfaces of the substrate 1. The cover element 2 is attached to a connection area 3 of the substrate 1, so that the top surface 10 of the substrate 1 and the rear surface 21 of the cover element 2 face each other. A cavity 4 is formed between the substrate 1 and the cover element 2.

A detection element 5, which is provided for the detection of electromagnetic radiation and may comprise a single element or an array of elements, is arranged at the top surface 10 of the substrate 1. In particular, the detection element 5 may be a photodetector or an array of photodetectors and may especially be suitable for the detection of infrared radiation. Details of the detection element can be adapted to individual applications.

For the purpose of detecting infrared radiation, in particular, the detection element 5 may be a passive infrared sensor. In this case, silicon dioxide, silicon nitride, titanium nitride, for instance, or any combination thereof may be applied as absorbing material. Metal-free regions may be provided in the region of the detection element 5 during the back-end-of-line process in order to allow the material surrounding the sensor to be removed by an etching process.

An integrated circuit 6, which is only schematically represented in FIG. 1, may optionally be provided by components in the substrate 1 and by an appertaining wiring. The integrated circuit 6 may typically be produced in the front-end-of-line of a CMOS process, for instance. It may comprise various components, including transistors and/or polysilicon elements, for example. Details of the optional integrated circuit 6 can be adapted to individual applications.

A wiring may be provided on or above the top surface 10 of the substrate 1. The optional wiring may typically include metal layers 7 and appertaining interconnections 9, which are embedded in a dielectric layer 8. The connection area 3 may be provided in the upper surface of the dielectric layer 8, for instance. An optional bonding layer 13 may be arranged between the dielectric layer 8 and the cover element 2 above the top surface 10 of the substrate 1.

In the embodiment according to FIG. 1, some of the metal layers 7 are connected to an optional through-substrate via or through-substrate interconnection, which comprises a via hole 12 in the substrate 1, an optional insulation 16 on the sidewall of the via hole 12, and a metallization 17 connecting a metal layer 7 to a corresponding electric terminal at the bottom surface 11 of the substrate 1.

Electric conductors may be provided above the bottom surface 11 of the substrate 1 as terminals for external electric connections, for instance. They may include conductor tracks, contact pads, structured redistribution layers or the like. The details of these conductors can be adapted to individual applications and are not shown in the figures.

The electric conductors may be covered with a further dielectric layer 18 above the bottom surface 11. Bump contacts 19 formed by solder balls may be arranged on contact pads within openings of the further dielectric layer 18.

The detection element 5 is arranged in the dielectric layer 8 and may be arranged on the substrate 1, or it may instead be provided with a small recess 15 or a plurality of such recesses 15 to isolate it from the substrate 1 and/or to release sensing elements, as shown in FIG. 1 by way of example. The recesses 15 may extend into the semiconductor material of the substrate 1. If the detection element 5 includes infrared sensors comprising polysilicon elements, the small recesses 15 may be formed around the polysilicon elements to enable them to sense the radiation.

At the rear surface 21 of the cover element 2, a refractive element 23 is provided by a protruding portion of the cover element 2 and is arranged opposite the detection element 5. The refractive element 23 is provided for directing the propagation of electromagnetic radiation. An optional recess 22 in the cover element 2 forms the cavity 4. The refractive element 23 may be produced by etching the material of the cover element 2, or it may instead be formed by injection molding, hot embossing or imprinting, for instance, depending on the material of the cover element 2.

The refractive element 23 is provided for improved electromagnetic radiation detection efficiency and may be any passive element that is suitable for the direction of electromagnetic radiation according to the laws of geometrical optics. The refractive element 23 may especially be a single lens or an array of lenses, for instance. Refractive optical elements have several advantages over diffractive optical elements like zone plates or Fresnel lenses, especially regarding chromatic aberration, angular tolerances and wavelength dependency of the focal length. The refractive element 23 can especially be provided to focus radiation, especially infrared radiation. In the appended figures the refractive element 23 is represented as a single plano-convex lens by way of example.

A reference detection element 14 may be supplied at the top surface 10 in the vicinity of the detection element 5 to serve as an offset or for zero calibration, especially to enable differential sensing and to enhance the linearity of the measurement. To this end, the reference detection element 14 may be screened from the radiation, especially by a metal shield, for example, or it may be arranged outside the focus of the refractive element 23. The reference detection element 14 may thus compensate for thermal drift or aging of the device.

Figure 2:
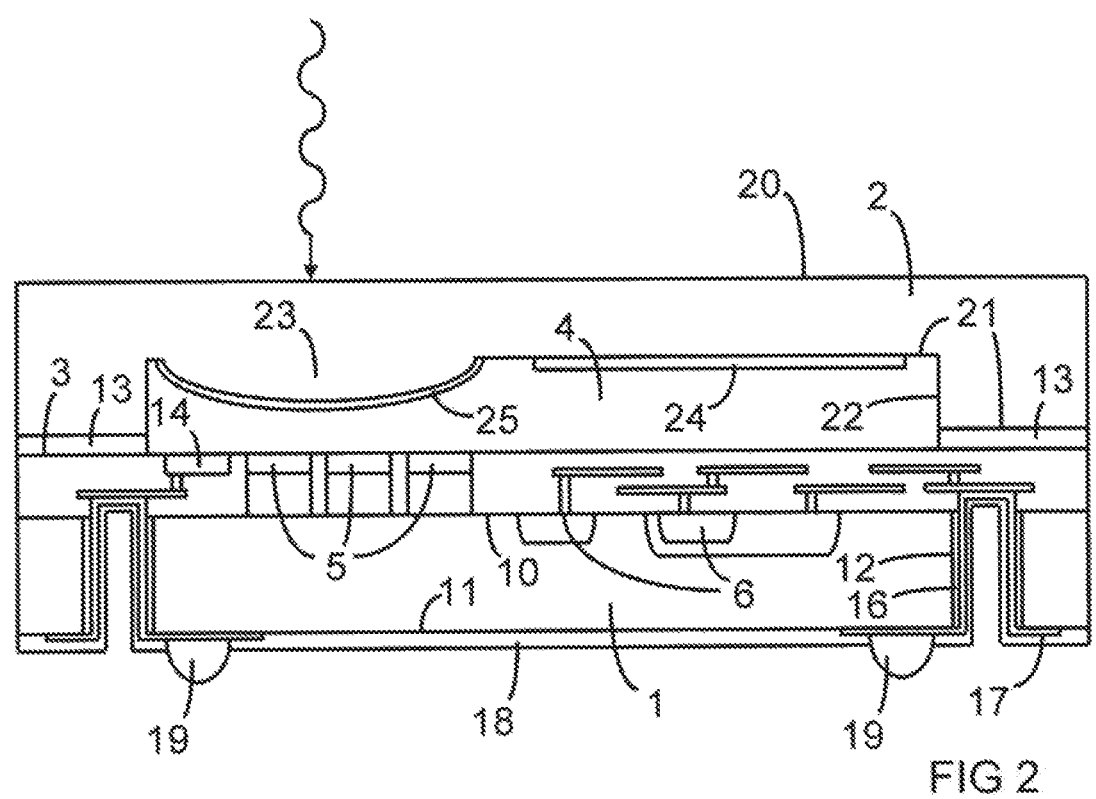
FIG. 2 is a cross section of a further embodiment comprising additional layers.

FIG. 2 is a cross section according to FIG. 1 of a further embodiment. The elements of the embodiment according to FIG. 2 that correspond to elements of the embodiment according to FIG. 1 are designated with the same reference numerals. The embodiment according to FIG. 2 differs from the embodiment according to FIG. 1 by a getter layer 24, which is arranged on the rear surface 21 of the cover element 2 within the recess 22, optionally on a plane area of the rear surface 21 outside the refractive element 23.

The getter layer 24 may be provided to stabilize the vacuum within the cavity 4. The getter layer 24 may particularly comprise a metal, like tungsten, titanium or any other metal that is liable to oxidation and adsorption at room temperature.

An antireflective coating 25 may be applied on the refractive element 23. The getter layer 24 and the antireflective coating 25 may be applied independently of one another in this embodiment and in any of the further embodiments described below.

Figure 3:
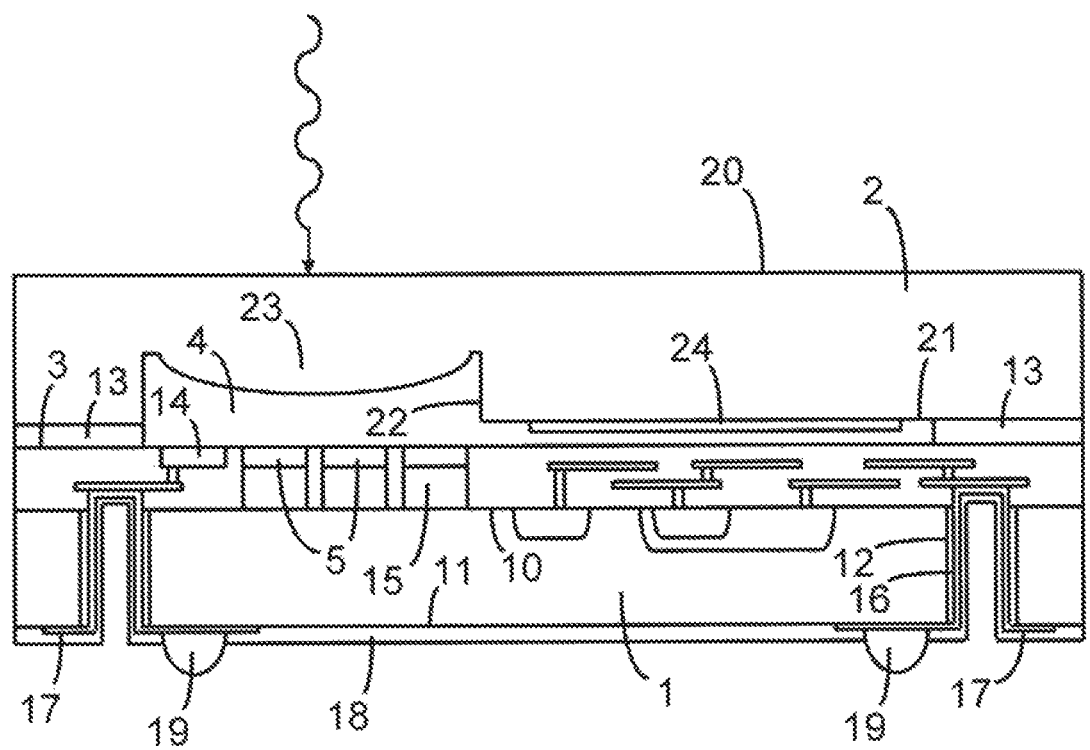
FIG. 3 is a cross section of a further embodiment having a different structure of the cover element.

FIG. 3 is a cross section of a further embodiment with a differently structured cover element. The elements of the embodiment according to FIG. 3 that correspond to elements of the embodiments according to FIGS. 1 and 2 are designated with the same reference numerals. The embodiment according to FIG. 3 differs from the embodiments according to FIGS. 1 and 2 by the shape of the recess 22 in the cover element 2. Whereas the refractive element 23 of the embodiments according to FIGS. 1 and 2 is formed in a larger recess 22, the embodiment according to FIG. 3 comprises a recess 22 of essentially the same lateral dimensions as the refractive element 23.

A part of the cavity 4 may be formed in a central opening of a bonding layer 13. Within the central opening, an optional getter layer 24 can be arranged on a plane area of the rear surface 21 of the cover element 2, thus being located inside the cavity 4 and outside the recess 22. An antireflective coating 25 may be applied on the refractive element 23, independently of the getter layer 24, as in the embodiment according to FIG. 2.

Figure 4:
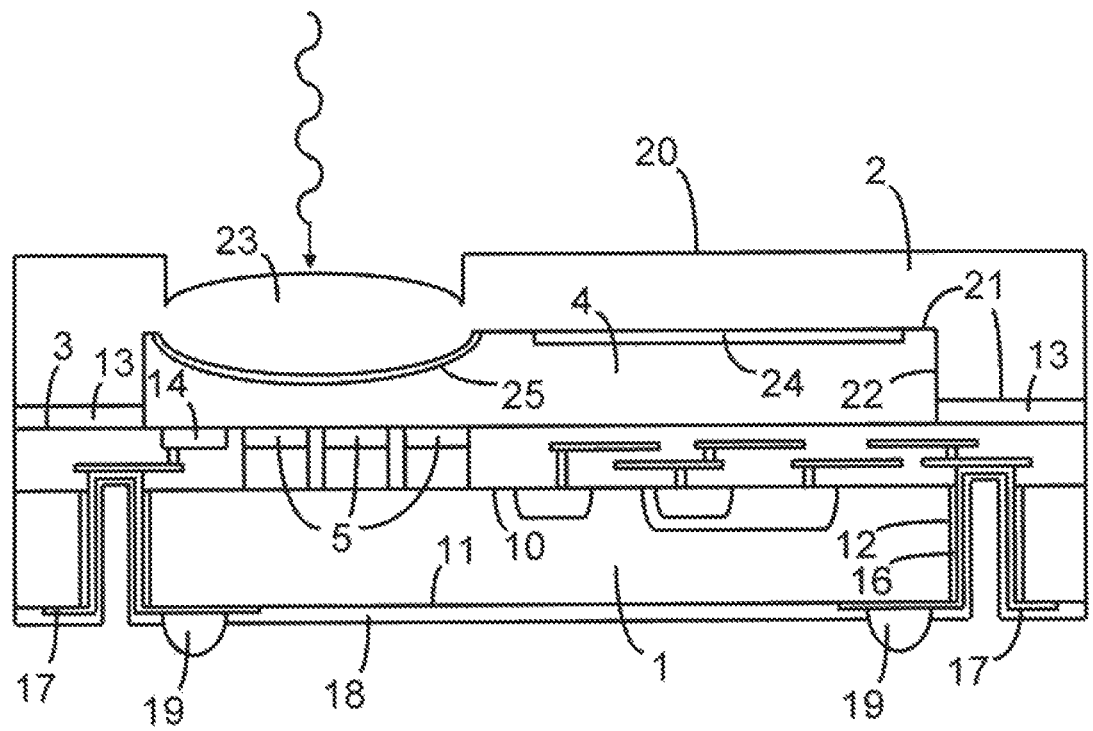
FIG. 4 is a cross section of a further embodiment having a different structure of the refractive element.

FIG. 4 is a cross section of a further embodiment comprising a structured front surface of the cover element. The elements of the embodiment according to FIG. 4 that correspond to elements of the embodiments according to FIGS. 1 and 2 are designated with the same reference numerals. The embodiment according to FIG. 4 differs from the embodiments according to FIGS. 1 and 2 by a structure of the front surface 20 of the cover element 2 within an area of the refractive element 23. To produce this embodiment, both front and rear surfaces 20, 21 of the cover element 2 have to be processed.

The structure of the front surface 20 of the cover element 2 brings about a modification of the refractive element 23. In particular, the refractive element 23 may thus be formed as a biconvex lens, as shown in FIG. 4 by way of example, in order to reduce the focal length.

Figure 5:
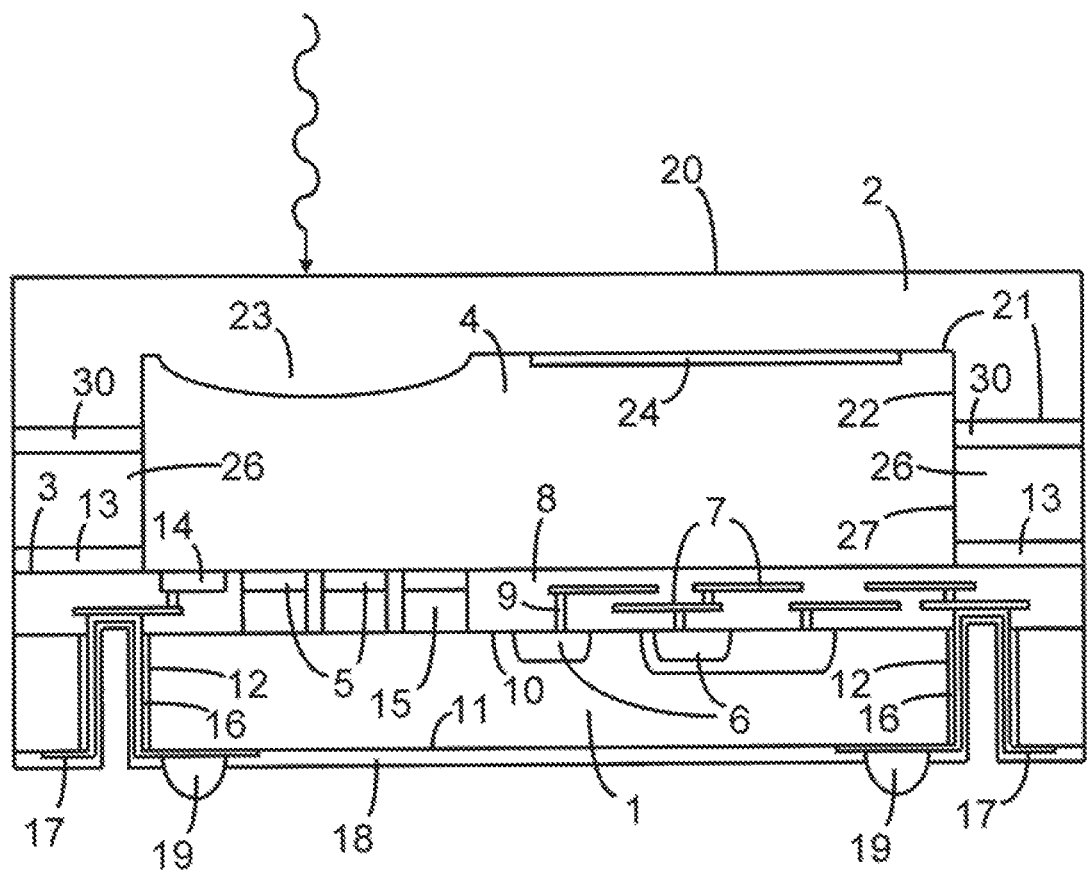
FIG. 5 is a cross section of a further embodiment comprising an intermediate layer.

FIG. 5 is a cross section of a further embodiment comprising a modification of the capping. The elements of the embodiment according to FIG. 5 that correspond to elements of the embodiments according to FIGS. 1 and 2 are designated with the same reference numerals. The embodiment according to FIG. 5 differs from the embodiments according to FIGS. 1 and 2 by an additional layer, which is arranged between the substrate 1 and the cover element 2 and thus forms an intermediate layer 26.

An opening 27 is formed in the intermediate layer 26. The opening 27 can be formed in a similar way as the recess 22 of the cover element 2, especially by etching, in particular if the intermediate layer 26 comprises the same material as the cover element 2. In the embodiment according to FIG. 5, the opening 27 penetrates the intermediate layer 26 and thus enlarges the cavity 4.

The intermediate layer 26 may be bonded to the dielectric layer 8 of the substrate 1. A dedicated bonding layer 13 may be provided as shown in FIG. 5. The cover element 2 may be bonded to the intermediate layer 26 by a further bonding layer 30. More than one intermediate layer may be provided for the capping, which can thus be formed as a stack of layers. Each intermediate layer can be provided with an opening.

Figure 6:
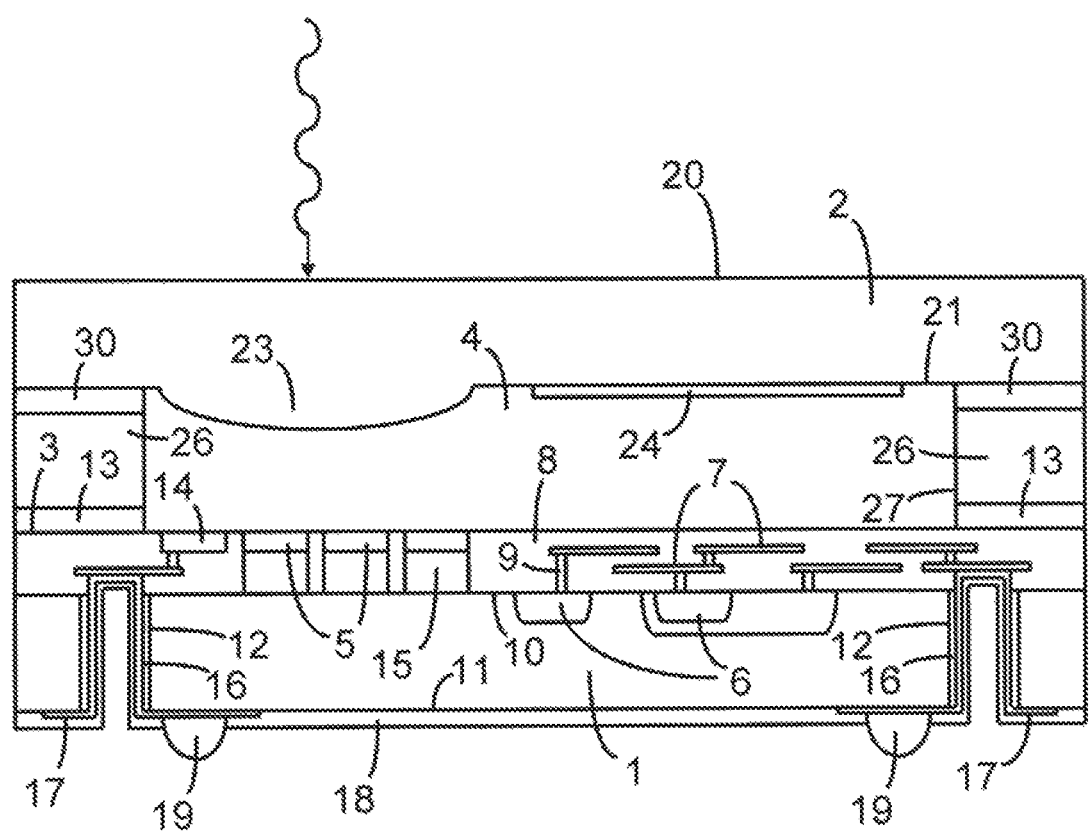
FIG. 6 is a cross section of a variant of the further embodiment according to FIG. 5.

FIG. 6 is a cross section according to FIG. 5 of a further embodiment comprising a modification of the cover element 2. The elements of the embodiment according to FIG. 6 that correspond to elements of the embodiment according to FIG. 5 are designated with the same reference numerals. In the embodiment according to FIG. 6, the cover element 2 is not provided with a recess, and the refractive element 23 protrudes an essentially plane area of the rear surface 21. The opening 27 of the intermediate layer 26 provides the cavity 4, which accommodates the refractive element 23. The optional getter layer 24 is represented in FIG. 6 by way of example. An antireflective coating 25 may be applied on the refractive element 23, independently of the getter layer 24, as in the embodiment according to FIG. 2.

Figure 7:
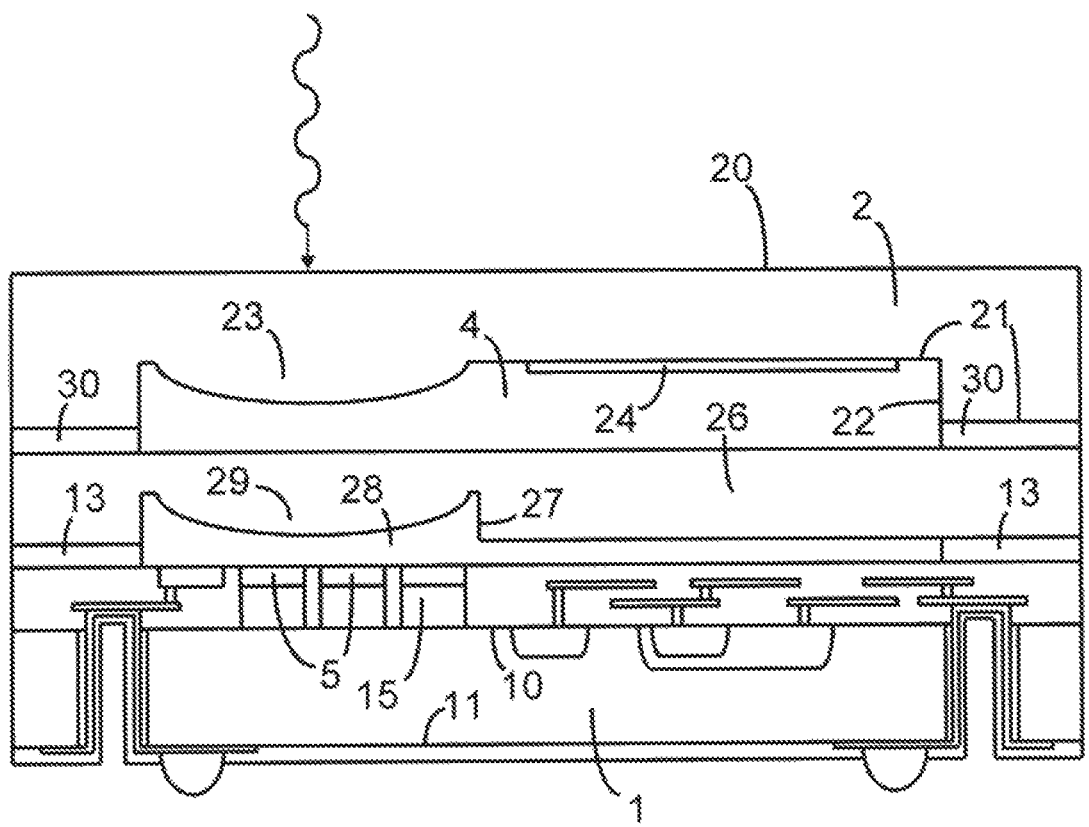
FIG. 7 is a cross section of a further embodiment according to FIG. 5 comprising a variant of the intermediate layer.

FIG. 7 is a cross section according to FIG. 5 of a further embodiment comprising a further modification of the capping. The elements of the embodiment according to FIG. 7 that correspond to elements of the embodiment according to FIG. 5 are designated with the same reference numerals. In the embodiment according to FIG. 7, the opening 27 is formed as a recess of the intermediate layer 26 and does not penetrate the intermediate layer 26, so that a further cavity 28 is formed between the substrate 1 and the intermediate layer 26. The further cavity 28 is separated from the cavity 4 by the intermediate layer 26.

A further refractive element 29 may be formed in the opening 27 as an integral part of the intermediate layer 26 and arranged opposite the detection element 5. The further refractive element 29 may be provided with an antireflective coating similar to the antireflective coating 25 of the refractive element 23 described above. An optional getter layer may also be arranged in the further cavity 28.

In the embodiment shown in FIG. 7 by way of example, the refractive element 23 and the further refractive element 29 are both plano-convex lenses, and the focal length of this doublet is smaller than the focal length of the refractive element 23 alone. If further layers forming a stack are provided for the capping, more than two refractive elements can be provided, which enable a wide range of applications for the direction of the electromagnetic radiation.

Figure 8:
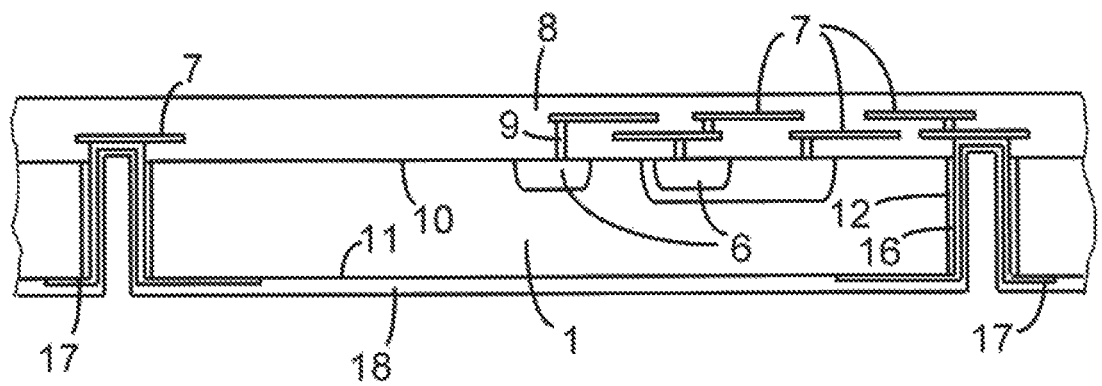
FIG. 8 is a cross section of an intermediate product of the method of producing the optoelectronic device.
Figure 9:
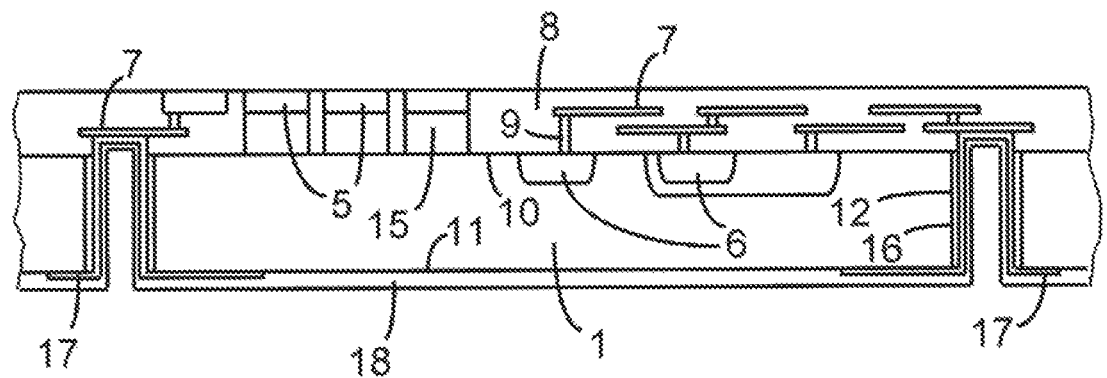
FIG. 9 is a cross section according to FIG. 8 after the application of detection elements.
Figure 10:
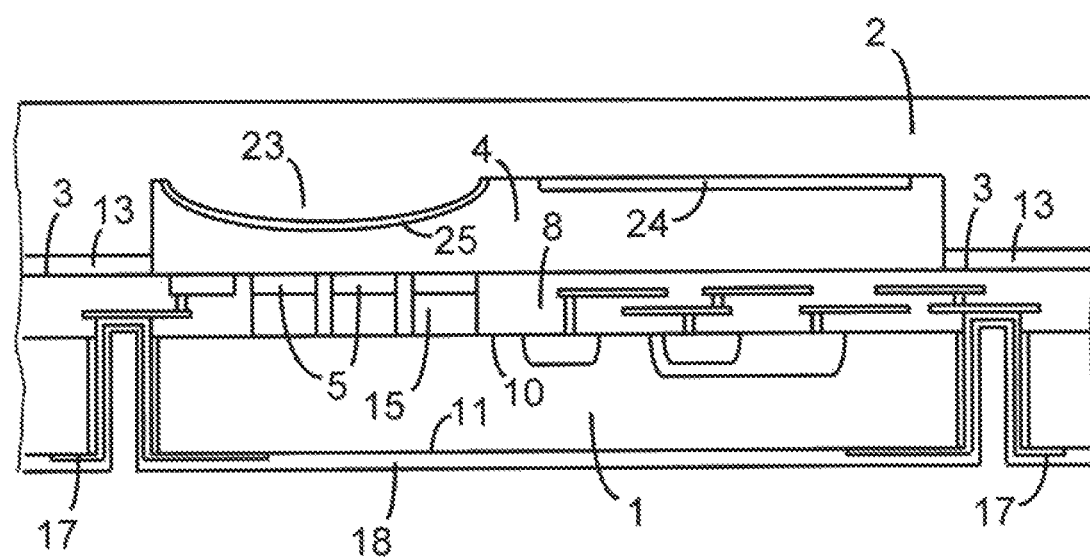
FIG. 10 is a cross section according to FIG. 9 after the application of the cover element.
Figure 11:
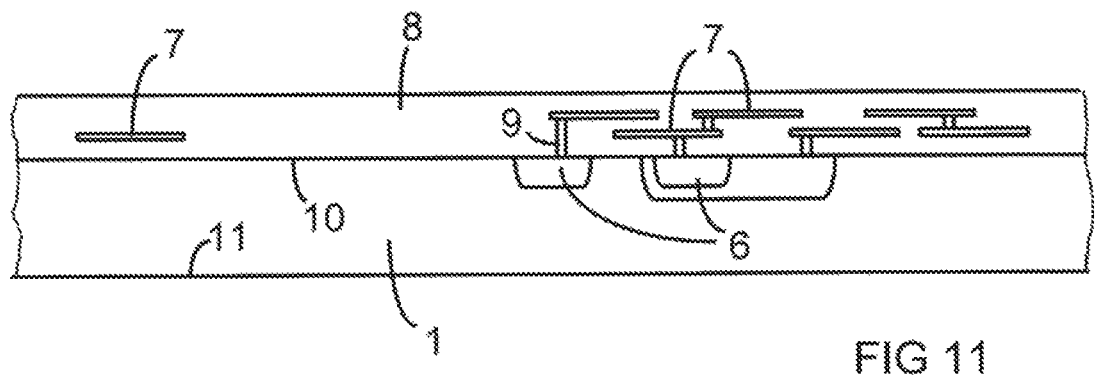
FIG. 11 is a cross section of an intermediate product of a variant of the method.
Figure 12:
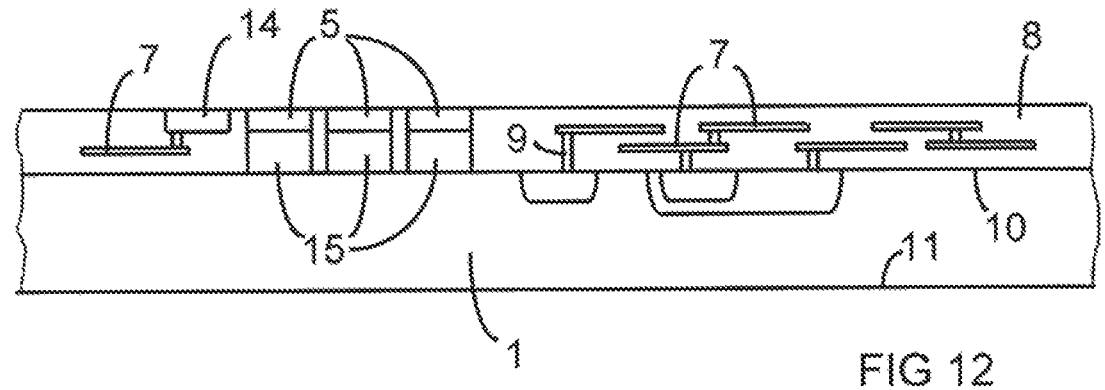
FIG. 12 is a cross section according to FIG. 11 after the application of detection elements.
Figure 13:
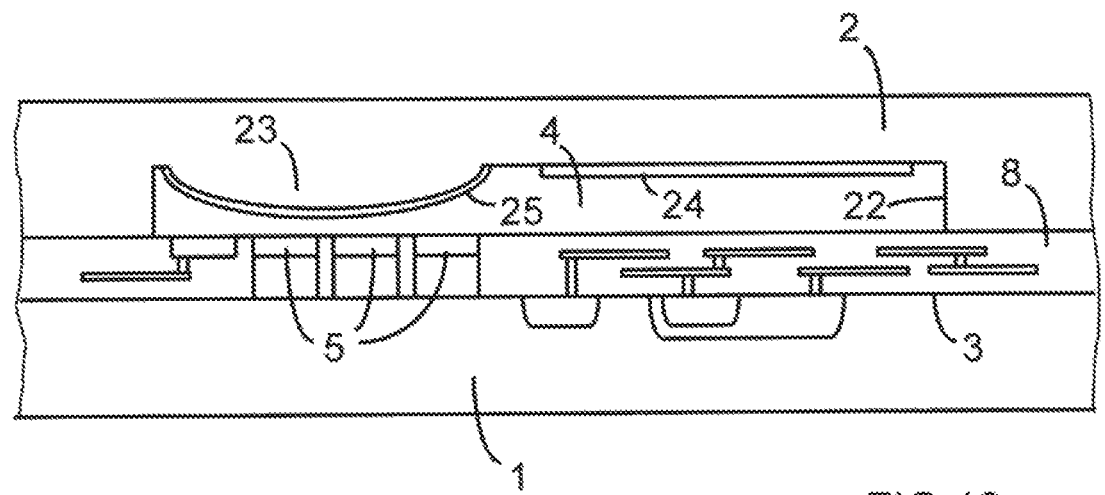
FIG. 13 is a cross section according to FIG. 12 after the application of the cover element.
Figure 14:
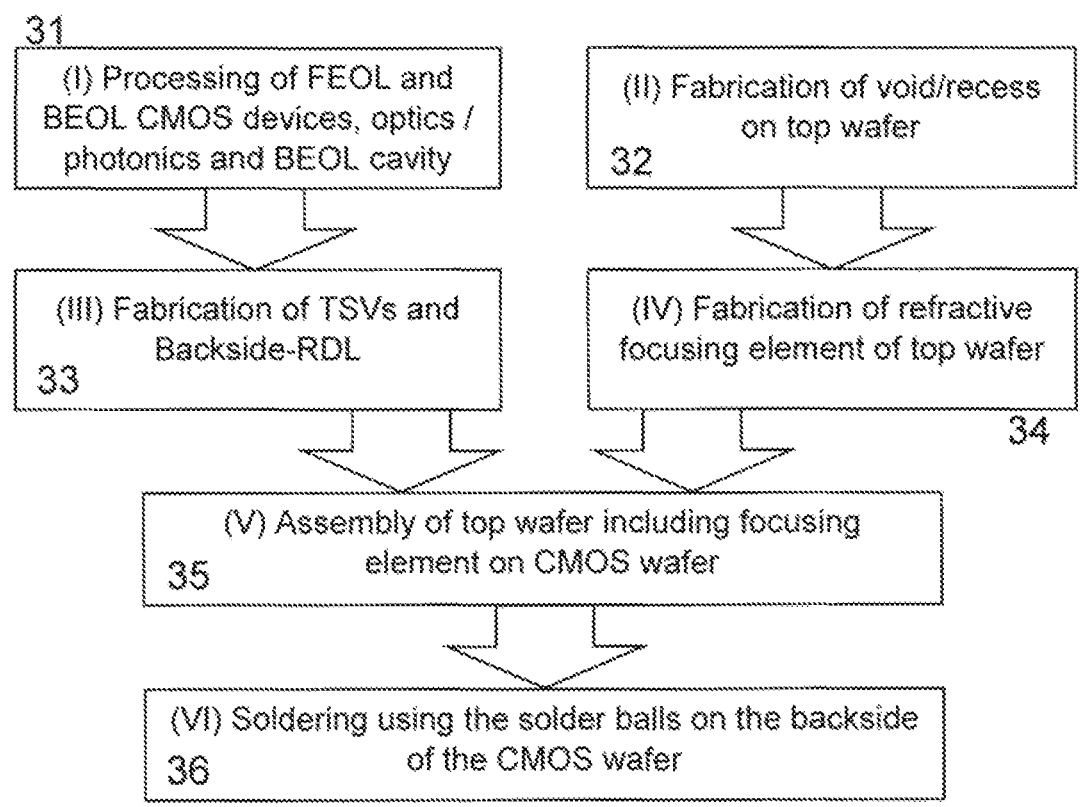
FIG. 14 is a flow diagram for the method according to FIGS. 8 to 10.
Figure 15:
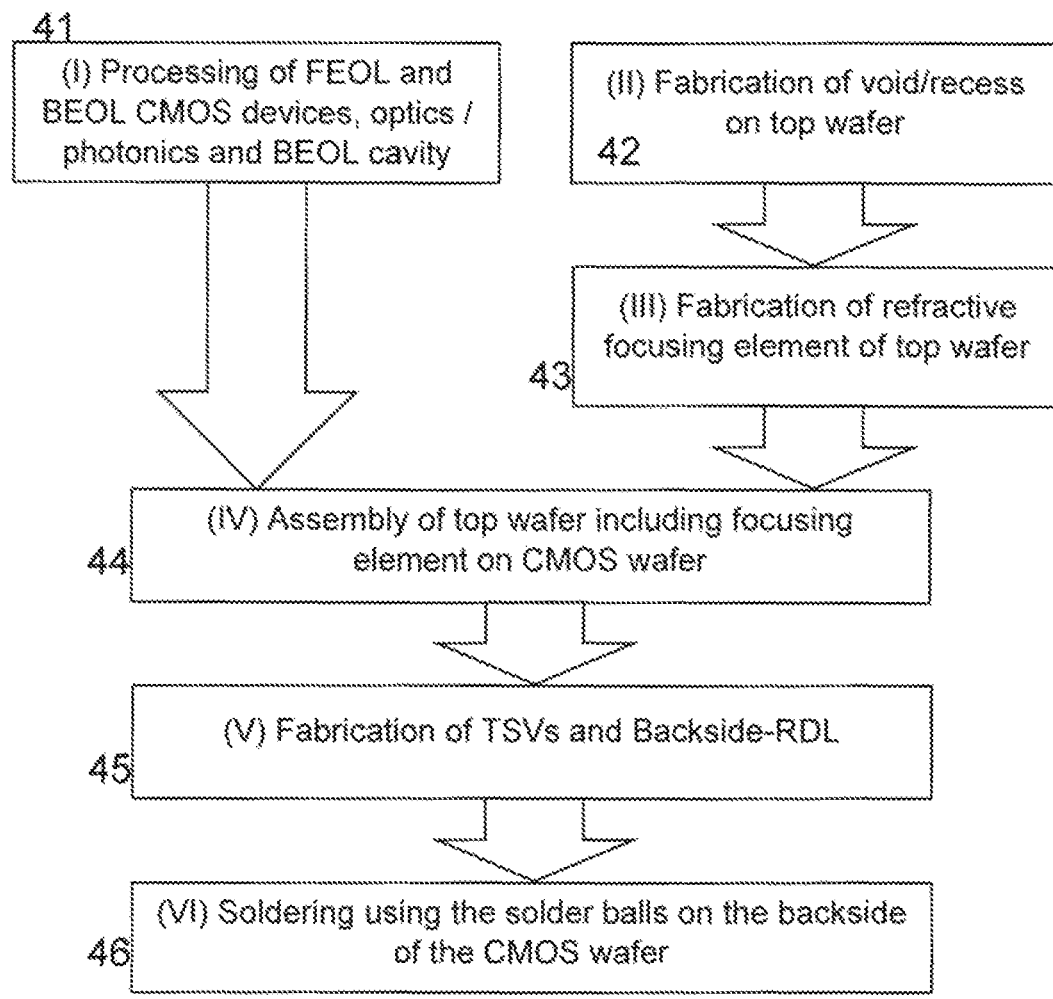
FIG. 15 is a flow diagram for the method according to FIGS. 11 to 13.

The following is a description of a method for producing such an optoelectronic device. FIGS. 8 to 10 are cross sections of intermediate products for a variant of the method in which through-substrate interconnections are formed in the substrate 1 before the cover element 2 is applied. FIGS. 11 to 13 are corresponding cross sections for a further variant in which through-substrate interconnections are formed in the substrate 1 after the cover element 2 is applied. FIGS. 14 and 15 are flow diagrams for these variants. FIGS. 16 to 21 are cross sections showing a further substrate after different steps of producing the refractive elements.

FIG. 8 is a cross section of a wafer provided as substrate. A plurality of devices can be produced on the wafer, which is separated into individual devices by wafer dicing, optionally after the application of the cover elements. Integrated circuits 6 and wirings comprising metal layers 7 and interconnections 9 embedded in the dielectric layer 8 may be produced in and on the substrate 1. After completing the front-end-of-line and the back-end-of-line of the manufacturing process, which may be a CMOS process, for example, interconnections through the substrate 1 formed by through-silicon vias and a back-side redistribution layer may be formed to enable backside contacting and packaging of the devices.

Through-substrate interconnections between the top and bottom surfaces 10, 11 of the substrate 1 comprise via holes 12 with insulations 16 on their sidewalls, and metallizations 17. A further dielectric layer 18 may cover the metallizations 17 and the bottom surface 11. The structure of the electric conductors can be adapted as desired to individual applications of the devices.

FIG. 9 is a cross section according to FIG. 8 after the application of detection elements 5, which may be released by forming recesses 15 in the dielectric layer 8 around the detection elements 5. The dielectric material may be removed by wet-chemical etching or dry-chemical etching, using, for example, buffered HF, hydrofluoric acid, xenon-difluoride, sulfurhexafluoride, tetrafluoromethane, buffered HF or HF vapor, or any combination thereof.

A further substrate provided as cover element is processed in parallel. In particular, the further substrate may be a further wafer. In a favorable variant, recesses are first produced in the further substrate, optionally by dry-chemical etching using gaseous species such as $SiCl_4$, $Cl_2$, $BCl_3$, $SF_6$, $C_4F_8$, $CF_4$, HBr, or $CHF_3$, for instance, or any combination thereof. The recesses are intended to form the cavities 4 and may have essentially the same lateral dimensions as the refractive elements, as shown in FIG. 3, or the recesses may exceed the lateral dimensions of the refractive elements, as shown in FIGS. 1, 2, 4, 5, 6 and 7.

The refractive elements can be formed in the recesses. The refractive elements may be produced by the same etching step whereby the recesses are produced or by a distinct further etching step. After the formation of the refractive elements, the recesses may be enlarged by further etching, provided that the shape of the refractive elements is not adversely affected or altered. Getter layers and/or antireflective coatings may be applied in the recesses.

FIG. 10 is a cross section according to FIG. 9 after the application of the cover element 2. The substrate 1 comprising the detection elements 5 and the further substrate provided with the refractive elements 23 are brought in contact and bonded together, so that the cavities 4 are formed and the refractive elements 23 are located opposite the detection elements 5. The bonding process may optionally be performed in an atmosphere where the pressure is below 0.01 mbar. Further method steps may include an application of bump contacts to the rear metallization.

Any of the embodiments described above can be obtained in this way. If an intermediate layer between the substrate 1 and the cover elements 2 is desired, a second further substrate may be processed in a similar way and applied above the top surface 10 of the substrate 1, before the further substrate providing the cover elements 2 is mounted.

FIG. 11 is a cross section of a wafer provided as substrate in a variant of the method. In this variant, the substrate 1 and the further substrate providing the cover element 2 are bonded before the through-substrate interconnections are produced. FIG. 11 shows the substrate 1 provided with integrated circuits 6 and wirings comprising metal layers 7 and interconnections 9 embedded in the dielectric layer 8.

FIG. 12 is a cross section according to FIG. 11 after the application of detection elements 5. The reference detection element 14 is optional and shown by way of example according to the preceding figures.

FIG. 13 is a cross section according to FIG. 12 after the application of the cover elements. Wafer-level bonding may be applied to attach the cover elements. Anodic bonding may instead be employed, using aluminum, for instance, as bonding material. Through-silicon vias and optional backside redistribution layers are formed in subsequent method steps to obtain any of the embodiments described above.

FIG. 14 is a flow diagram for the method according to FIGS. 8 to 10. Method step 31 includes the front-end-of-line (FEOL) and the back-end-of-line (BEOL) of the manufacturing process for the substrate 1, and an optional etching step to form the recesses 15 releasing the detection elements 5. The further method step 32 is the formation of the recess in a wafer provided for the cover elements. The further method step 33 includes the formation of the optional through-substrate interconnections or through-substrate vias (TSVs) and, optionally, a backside redistribution layer (RDL). The further method step 34 is the formation of the refractive element, which is specified as a refractive focusing element by way of example. The further method step 35 is the assembly of the cover elements (top wafer) on the substrate, which is specified as CMOS wafer by way of example. The further method step 36 is the external electric connection by soldering using bump contacts on the bottom surface 11.

FIG. 15 is a flow diagram for the method according to FIGS. 11 to 13. Method step 41 includes the front-end-of-line (FEOL) and the back-end-of-line (BEOL) of the manufacturing process for the substrate 1, and an optional etching step to form the recesses 15 releasing the detection elements 5. The further method step 42 is the formation of the recess in a wafer provided for the cover elements. The further method step 43 is the formation of the refractive element, which is specified as a refractive focusing element by way of example. The further method step 44 is the assembly of the cover elements (top wafer) on the substrate, which is specified as CMOS wafer by way of example. The further method step 45 includes the formation of the optional through-substrate interconnections or through-substrate vias (TSVs) and, optionally, a backside redistribution layer (RDL). The further method step 46 is the external electric connection by soldering using bump contacts on the bottom surface 11.

FIGS. 16 to 19 are cross sections of a further substrate 37, which may be a wafer, for example, after different steps of a method of producing the refractive elements, which uses photolithography. In this example, the refractive elements are single convex lenses.

Figure 16:
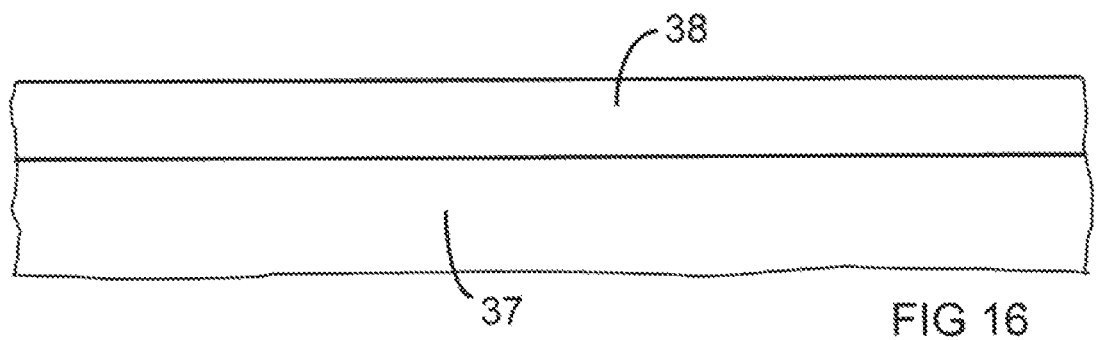
FIG. 16 is a cross section of a further substrate provided for the cover element, with a reflow layer applied on the surface of the further substrate.

FIG. 16 is a cross section of the further substrate 37 with a reflow layer 38 applied on its surface. The thickness of the reflow layer 38 may typically be between 50% and 200% of the targeted thickness of the refractive element. The reflow layer 38 can be a conventional photoresist, for instance. In particular, the reflow layer may be a temperature stable positive photoresist, for example, or a negative-tone electron beam lithography resist, such as HSQ (hydrogen silsesquioxane).

Figure 17:
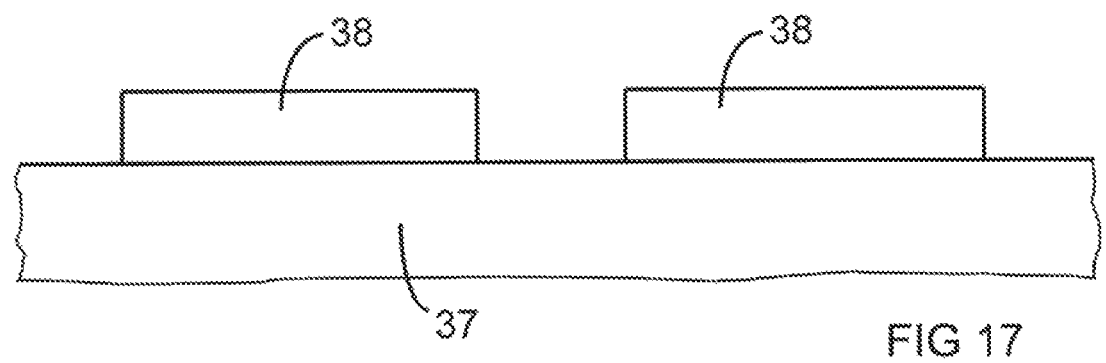
FIG. 17 is a cross section according to FIG. 16 after a first step of structuring the reflow layer.

FIG. 17 is a cross section according to FIG. 16 after structuring the reflow layer 38 into separate portions defining the outer contours of the refractive elements that are to be produced. The lateral size of the separate portions of the reflow layer 38 essentially corresponds to the lateral size of the refractive elements.

Figure 18:
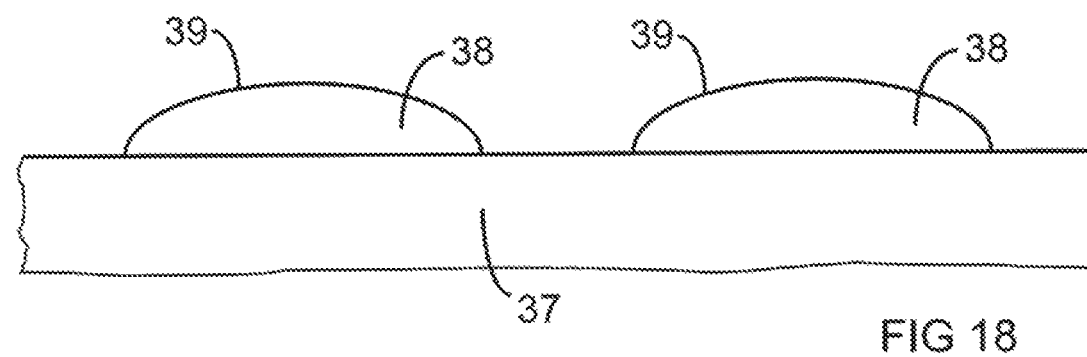
FIG. 18 is a cross section according to FIG. 17 after a second step of structuring the reflow layer.

FIG. 18 is a cross section according to FIG. 17 after further structuring the reflow layer 38. The reflow layer 38 is baked above glass temperature to perform a re-flow. The baking temperature for a polymeric photoresist may typically be between 140° C. and 160° C., in particular about 150° C., and for HSQ between 350° C. and 450° C., in particular about 400° C. The surface tension, which depends on the size and volume of the reflow layer 38, determines the shape of the resulting curved surface 39, and particularly the angle that is formed by the curved surface 39 and the plane upper surfaces of the further substrate 37 at the lateral lower edges of the separate portions of the reflow layer 38.

Figure 19:
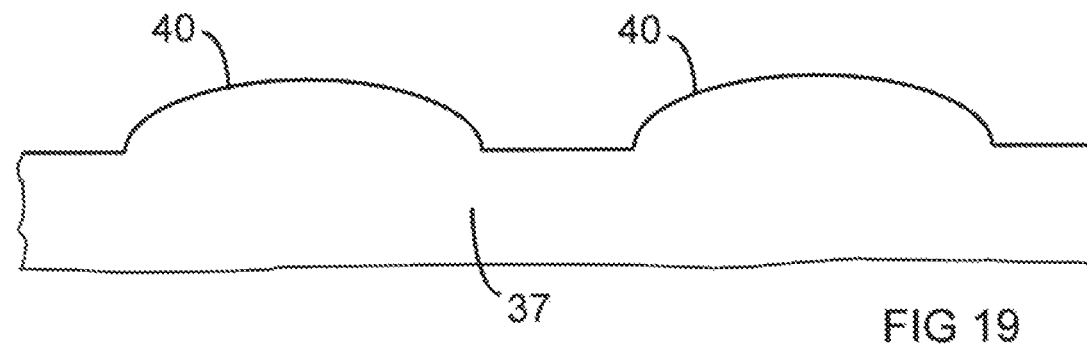
FIG. 19 is a cross section of the further substrate after the transfer of the structure of the reflow layer.

FIG. 19 is a cross section of the further substrate 37 after a transfer of the shape of the reflow layer 38, whereby the further substrate 37 is provided with a surface structure 40 that is similar to the curved surface 39. This transfer may be effected by dry-chemical etching, for example. If the further substrate 37 is a silicon wafer, for example, the selectivity of the etch process between the reflow layer and silicon may be typically 1:1. The etch process may instead have a selectivity that deviates from 1:1, particularly if aspheric lenses are to be formed, for example. In particular, the etching is performed by $SF_6$, $CF_4$ or Ar, or any combination thereof. The etching chemistry may instead contain HBr and $BCl_3$.

The resulting surface structure 40 shown in FIG. 19 forms the refractive elements 23. The production of the refractive elements 23 using photolithography has been described for a flat surface of the further substrate 37, but the refractive elements 23 may as well be produced within recesses of the further substrate by the same method.

Figure 20:
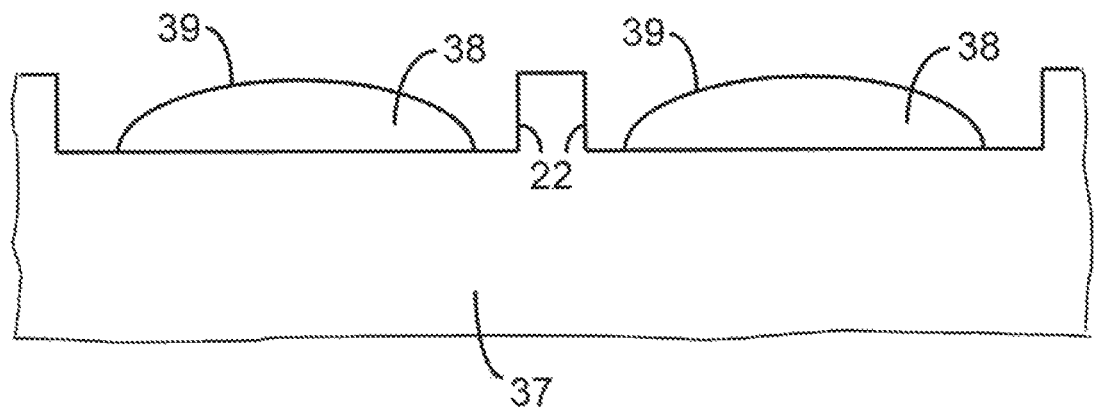
FIG. 20 is a cross section according to FIG. 18 for a variant using a recess in the further substrate.

FIG. 20 is a cross section according to FIG. 18 for an alternative structure of the further substrate 37. In this variant, recesses 22 are formed before the reflow layer 38 is formed and structured. The structure of the recesses 22 is essentially maintained when the shape of the structured reflow layer 38 is transferred to the further substrate 37.

Figure 21:
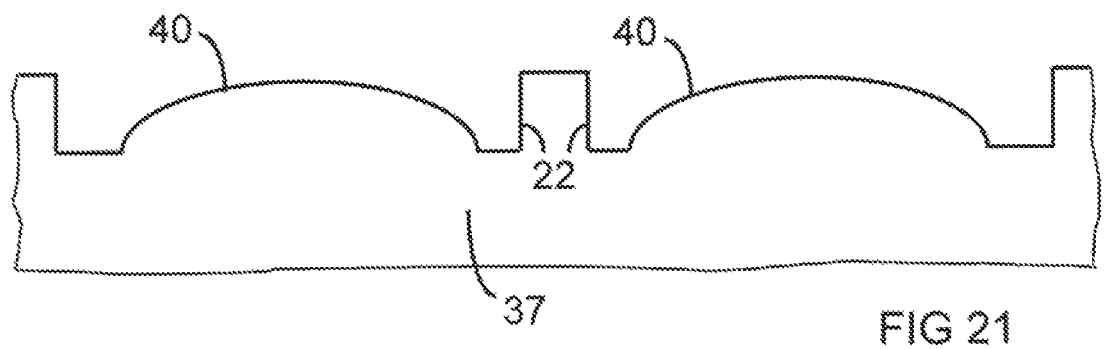
FIG. 21 is a cross section according to FIG. 19 for the variant according to FIG. 20.

FIG. 21 is a cross section according to FIG. 20 after the transfer of the shape of the structured reflow layer 38, whereby the further substrate 37 is provided with a surface structure 40 that is similar to the curved surface 39. The surface structure 40 is thus formed in the recesses 22.

In the variant according to FIG. 18, similar recesses 22 may be produced during the transfer of the shape of the structured reflow layer 38. For this purpose, regions between the areas that are provided for the recesses may be masked, so that a grating of ridges is left between the recesses 22.

Advantages of the optoelectronic device are the prevention of surface contaminations, which might alter the performance of a refractive element, and physical damage when the device is exposed to the environment. Instead, the refractive element 23 is located within the optoelectronic device and thus not susceptible to contaminations or harsh environments. Manufacturing is facilitated by one-sided wafer processing, which does not require special handling tools like dicing tapes, chucks or die pick-up tools. A refractive element according to the above description is especially favorable for infrared sensors, because it provides a high collection efficiency and excellent performance for improved radiation detection sensitivity as well as improved optical performance compared to diffractive optical elements.

The invention claimed is:
1. An optoelectronic device, comprising:
a substrate having a top surface;
a cover element attached to the substrate above the top surface, the cover element having a rear surface facing the top surface of the substrate;
a detection element, which is provided for detecting electromagnetic radiation, arranged at the top surface of the substrate;

a further element, which is provided for directing electromagnetic radiation, arranged above the detection element;
a dielectric layer arranged between the substrate and the cover element, the detection element being arranged in the dielectric layer;
a metal layer arranged in the dielectric layer;
a through-substrate interconnection arranged in the substrate, the through-substrate interconnection contacting the metal layer; and
the further element being a refractive element, which is formed by a portion of the cover element at the rear surface.

2. The optoelectronic device according to claim 1, further comprising:
a recess at the rear surface of the cover element, the recess forming a cavity between the detection element and the refractive element.

3. The optoelectronic device according to claim 1, further comprising:
an intermediate layer arranged between the substrate and the cover element, the intermediate layer comprising an opening between the detection element and the refractive element.

4. The optoelectronic device according to claim 1, further comprising:
a recess at the rear surface of the cover element; and
an intermediate layer, which is different from the dielectric layer, being arranged between the substrate and the cover element, the intermediate layer comprising an opening between the detection element and the refractive element, the recess and the opening forming a cavity between the detection element and the refractive element.

5. The optoelectronic device according to claim 1, further comprising:
a recess at the rear surface of the cover element, the recess forming a cavity between the detection element and the refractive element;
an intermediate layer, which is different from the dielectric layer, being arranged between the substrate and the cover element; and
an opening of the intermediate layer, the opening forming a further cavity between the detection element and the refractive element, the further cavity being separated from the cavity by the intermediate layer.

6. The optoelectronic device according to claim 5, further comprising:
a further refractive element formed in the intermediate layer within the further recess.

7. The optoelectronic device according to claim 1, further comprising:
an integrated circuit in the substrate.

8. The optoelectronic device according to one of claim 2, wherein
the refractive element extends over the entire rear surface of the cover element within the recess.

9. The optoelectronic device according to one of claim 2, further comprising:
a getter layer applied to the rear surface of the cover element within the recess.

10. The optoelectronic device according to claim 1, further comprising:
a front surface of the cover element, the front surface being opposite the rear surface; and
the front surface being structured in the area of the refractive element.

11. A method of producing an optoelectronic device, comprising:
providing a substrate with a dielectric layer and arranging detection elements and a metal layer in the dielectric layer, the detection elements being provided for detecting electromagnetic radiation;
forming a through-substrate interconnection in the substrate, the through-substrate interconnection contacting the metal layer;
providing a further substrate with surface structures forming refractive elements; and
attaching the further substrate to the substrate, the surface structures facing the detection elements, and the dielectric layer being arranged between the substrate and the further substrate.

12. The method according to claim 11, wherein
the surface structures of the further substrate are formed within recesses.

13. The method according to claim 11, further comprising:
forming the through-substrate interconnection, including a via hole and a metallization, before the further substrate is bonded to the substrate.

14. The method according to claim 11, further comprising:
forming the through-substrate interconnection, including a via hole and a metallization, after the further substrate is bonded to the substrate.

15. The method according to claim 11, further comprising:
forming the surface structures of the further substrate by applying a reflow layer on the further substrate,
structuring the reflow layer to form separate portions having curved surfaces, and
transferring the curved surfaces to the further substrate.

16. An optoelectronic device, comprising:
a substrate having a top surface;
a cover element attached to the substrate above the top surface, the cover element having a rear surface facing the top surface of the substrate;
a detection element arranged at the top surface of the substrate, the detection element being provided for detecting electromagnetic radiation;
a dielectric layer arranged between the substrate and the cover element, the detection element being arranged in the dielectric layer;
a refractive element formed by a portion of the cover element at the rear surface above the detection element, the refractive element being provided for directing electromagnetic radiation;
a metal layer arranged in the dielectric layer;
a through-substrate interconnection arranged in the substrate, the through-substrate interconnection contacting the metal layer;
a recess at the rear surface of the cover element, the recess forming a cavity between the detection element and the refractive element;
an intermediate layer arranged between the substrate and the cover element, the intermediate layer being different from the dielectric layer; and
an opening of the intermediate layer, the opening forming a further cavity between the detection element and the refractive element, the further cavity being separated from the cavity by the intermediate layer.

17. The optoelectronic device according to claim 16, further comprising:

a further refractive element formed in the intermediate layer within the further recess.

\* \* \* \* \*